(12) United States Patent
Gavert et al.

(10) Patent No.: US 9,712,121 B2
(45) Date of Patent: Jul. 18, 2017

(54) CIRCUITS FOR LINEARIZING AN OUTPUT SIGNAL OF A NON-LINEAR COMPONENT AND RELATED DEVICES AND METHODS

(71) Applicant: Telefonaktiebolaget L M Ericsson (publ), Stockholm (SE)

(72) Inventors: Bjorn Gavert, Gothenburg (SE); Tony Gustafsson, Askim (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/403,182

(22) PCT Filed: Nov. 22, 2014

(86) PCT No.: PCT/EP2014/075345
§ 371 (c)(1),
(2) Date: Nov. 23, 2014

(87) PCT Pub. No.: WO2016/078732
PCT Pub. Date: May 26, 2016

(65) Prior Publication Data
US 2016/0352290 A1    Dec. 1, 2016

(51) Int. Cl.
*H04B 1/04*         (2006.01)
*H03F 1/32*         (2006.01)
(Continued)

(52) U.S. Cl.
CPC ......... *H03F 1/3241* (2013.01); *H03F 1/3247* (2013.01); *H03F 1/3258* (2013.01);
(Continued)

(58) Field of Classification Search
CPC ... H03F 1/3241; H03F 1/3247; H04L 27/367; H04L 27/368
(Continued)

(56) References Cited

U.S. PATENT DOCUMENTS

2005/0212596 A1    9/2005    Batruni
2013/0142284 A1    6/2013    Asensio et al.
2014/0161207 A1    6/2014    Teterwak

FOREIGN PATENT DOCUMENTS

EP    2 779 441 A1    9/2014

OTHER PUBLICATIONS

PCT International Search Report, mailed Jul. 10, 2015, in connection with International Application No. PCT/EP2014/075345, all pages.
(Continued)

*Primary Examiner* — Lee Nguyen
(74) *Attorney, Agent, or Firm* — Leffler Intellectual Property Law, PLLC

(57) ABSTRACT

This disclosure provides a circuit for linearizing an output signal Sout produced by a non-linear component based on an input signal x(n). The circuit comprises a primary pre-distorter module configured to generate a pre-distorted signal y(n) based on the input signal x(n) and a primary pre-distortion function parameterized by a pre-distortion parameter λ and to feed the pre-distorted signal y(n) to the non-linear component. The circuit comprises an estimation module. The estimation module is configured to receive samples z(n) of the output signal Sout, and to determine the pre-distortion parameter λ. The estimation module comprises a secondary pre-distorter module configured to generate a secondary pre-distorter output signal r(n) based on a secondary pre-distortion function and the samples z(n) of the output signal Sout. The secondary pre-distorter module is configured to determine the pre-distortion parameter λ based on a previously determined pre-distortion parameter stored on a data storage, the secondary pre-distorter output signal r(n) and the pre-distorted signal y(n) provided by the primary pre-distorted module. The determining comprises cor-
(Continued)

relating the input signal x(n) with an error signal between the pre-distorted signal y(n) and the secondary pre-distorter output signal r(n).

22 Claims, 5 Drawing Sheets

(51) Int. Cl.
  *H03F 3/195*  (2006.01)
  *H03F 3/24*  (2006.01)
  *H04B 1/40*  (2015.01)
  *H04L 25/03*  (2006.01)
  *H03C 1/62*  (2006.01)
  *H04L 27/36*  (2006.01)

(52) U.S. Cl.
  CPC ............... *H03F 3/195* (2013.01); *H03F 3/24* (2013.01); *H03F 3/245* (2013.01); *H04B 1/40* (2013.01); *H04L 25/03343* (2013.01); *H03F 2201/3209* (2013.01); *H03F 2201/3212* (2013.01); *H03F 2201/3224* (2013.01); *H03F 2201/3233* (2013.01); *H04L 27/368* (2013.01)

(58) Field of Classification Search
  USPC ............................... 455/114.3; 375/396, 297
  See application file for complete search history.

(56) References Cited

OTHER PUBLICATIONS

PCT Written Opinion, mailed Jul. 10, 2015, in connection with International Application No. PCT/EP2014/075345, all pages.
PCT International Preliminary Report on Patentability, mailed Oct. 19, 2016, in connection with International Application No. PCT/EP2014/075345, all pages.

CIRCUITS FOR LINEARIZING AN OUTPUT SIGNAL OF A NON-LINEAR COMPONENT AND RELATED DEVICES AND METHODS

TECHNICAL FIELD

The present disclosure relates to electronic circuits and devices and in particular to pre-distortion in such circuits and devices.

BACKGROUND

In electronic equipment, a component may exhibit non-linear characteristics that degrade the performance of such equipment. Special care must be taken when designing this component as operating only in a linear region of the component results in lower efficiency of the component. For example, power amplifiers that are used to amplify a signal prior to its transmission often reveal a non-linear distortion of the transmitted signal when used for excessive amplification, i.e., gain outside the linear gain region of the amplifier. Traditionally power amplifiers had to be linear, for example of class A type, which resulted in a very low power efficiency, i.e., the output power from the power amplifier is far from the saturated power of the power amplifier.

The non-linear behavior of a non-linear component creates distortion of the signal produced by such component. The distortion may be handled by performing digital pre-compensation of the signal or pre-distortion of the signal. A digital pre-compensation is carried out by a Digital Pre-Distorter, DPD, which compensates for the distortion introduced by the non-linear component. Non-linear distortion mitigation such as with DPD involves finding pre-distortion parameters, even in the presence of noise. Finding the optimal pre-distortion parameter in the presence of noise is difficult. Moreover, as the order of non-linearity of the non-linear component grows, so does the complexity of the pre-distortion solution. State-of-the-art DPD algorithms tend to present convergence issues, be associated with bias problems in the presence of noise, and/or be quite complex.

At least partly due to the above, there is a need for a distortion mitigation solution with improved convergence and/or reduced complexity to be used with the non-linear component.

SUMMARY

An object of the present disclosure is to provide a circuit, a digital signal processing device, a radio-link transceiver, and a method which seeks to mitigate, alleviate, or eliminate one or more of the above-identified deficiencies in the art and disadvantages singly or in any combination.

This object is obtained by a circuit for linearizing an output signal Sout produced by a non-linear component based on an input signal $x(n)$. The circuit comprises a primary pre-distorter module configured to generate a pre-distorted signal $y(n)$ based on the input signal $x(n)$ and a primary pre-distortion function g( ) parameterized with a pre-distortion parameter $\lambda_{k-1}$ and to feed the pre-distorted signal $y(n)$ to the non-linear component. The circuit comprises an estimation module. The estimation module is configured to receive samples $z(n)$ of the output signal Sout, and to determine the pre-distortion parameter $\lambda_k$. The estimation module comprises a secondary pre-distorter module configured to generate a secondary pre-distorter output signal $r(n)$ based on a secondary pre-distortion function g'( ) and the samples $z(n)$ of the output signal Sout. The secondary pre-distorter module is configured to determine the pre-distortion parameter $\lambda_k$ based on a previously determined pre-distortion parameter stored on a data storage, the secondary pre-distorter output signal $r(n)$ and the pre-distorted signal $y(n)$ provided by the primary pre-distorted module. The determining comprises correlating the input signal $x(n)$ with an error signal between the pre-distorted signal $y(n)$ and the secondary pre-distorter output signal $r(n)$.

Thus, the primary pre-distorter module uses a $(k-1)$:th version of the pre-distortion parameter $\lambda$, while the secondary pre-distorter module determines a k:th version of said pre-distortion parameter $\lambda$.

Hereby, non-linear distortion effects of the non-linear component on the output signal Sout are compensated for or reduced even in the presence of noise, because a bias due to noise present in samples $z(n)$ of the output signal Sout is significantly reduced using the present technique. This results in the circuit providing a higher efficiency of the non-linear component, such as a higher power efficiency for a power amplifier.

According to some aspects, the secondary pre-distortion function g'( ) takes the input signal $x(n)$ of the primary pre-distorter module as an argument in order to determine the pre-distortion parameter $\lambda_k$. Determining the pre-distortion parameter with the secondary pre-distortion function g'( ) that takes the input signal $x(n)$ of the primary pre-distorter module as an argument provides a faster convergence to optimal or near-optimal pre-distortion parameters. Optimal pre-distortion parameters when used in the primary pre-distorter module allow the primary pre-distorter module to generate a pre-distorted signal $y(n)$ to the non-linear component that result in a minimized or reduced distortion from the non-linear component, and possibly also in a better linearized output signal Sout.

According to some other aspects, the secondary pre-distortion function g'( ) comprises a look-up table. The look-up table comprises determined pre-distortion parameters indexed using an amplitude of the input signal $x(n)$.

According to some other aspects, the secondary pre-distortion function g'( ) comprises a polynomial with the input signal $x(n)$ as an argument and determined pre-distortion parameters as coefficients.

There is also disclosed herein a digital signal processing device for linearizing a non-linear component, the digital signal processing device comprising a circuit discussed above.

This disclosure also relates to a radio-link transceiver. The radio-link transceiver comprises a non-linear component configured to obtain the pre-distorted signal and to transform the pre-distorted signal into an output signal to be transmitted. The radio-link transceiver comprises a digital signal processing device as disclosed above, configured to provide a pre-distorted signal to the non-linear component.

According to some other aspects, the non-linear component comprises a power amplifier, and/or a mixer.

The object is furthermore obtained by a method, performed in a circuit, for linearizing an output signal Sout produced by a non-linear component based on an input signal $x(n)$. The method comprises receiving samples $z(n)$ of the output signal Sout. The method comprises generating a secondary pre-distorter output signal $r(n)$ based on a secondary pre-distortion function g'( ) and the samples $z(n)$. The method comprises determining a pre-distortion parameter $\lambda_k$ based on a previously determined pre-distortion parameter, the secondary pre-distorter output signal $r(n)$ and a pre-distorted signal $y(n)$. The step of determining comprises correlating the input signal x(n) with an error signal between the pre-distorted signal y(n) and the secondary pre-distorter output signal r(n).

According to some aspects, the step of determining a pre-distortion parameter comprises applying the secondary pre-distortion function g'( ) 115 that is configured to take the input signal x(n) as an argument.

In addition to the above method, there is also provided herein computer programs comprising computer program code which, when executed in a device, causes the device, to execute methods according to the present teaching.

The computer programs, the methods, the digital signal processing devices and the radio-link transceivers, provide advantages corresponding to the advantages already described in relation to the circuit.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
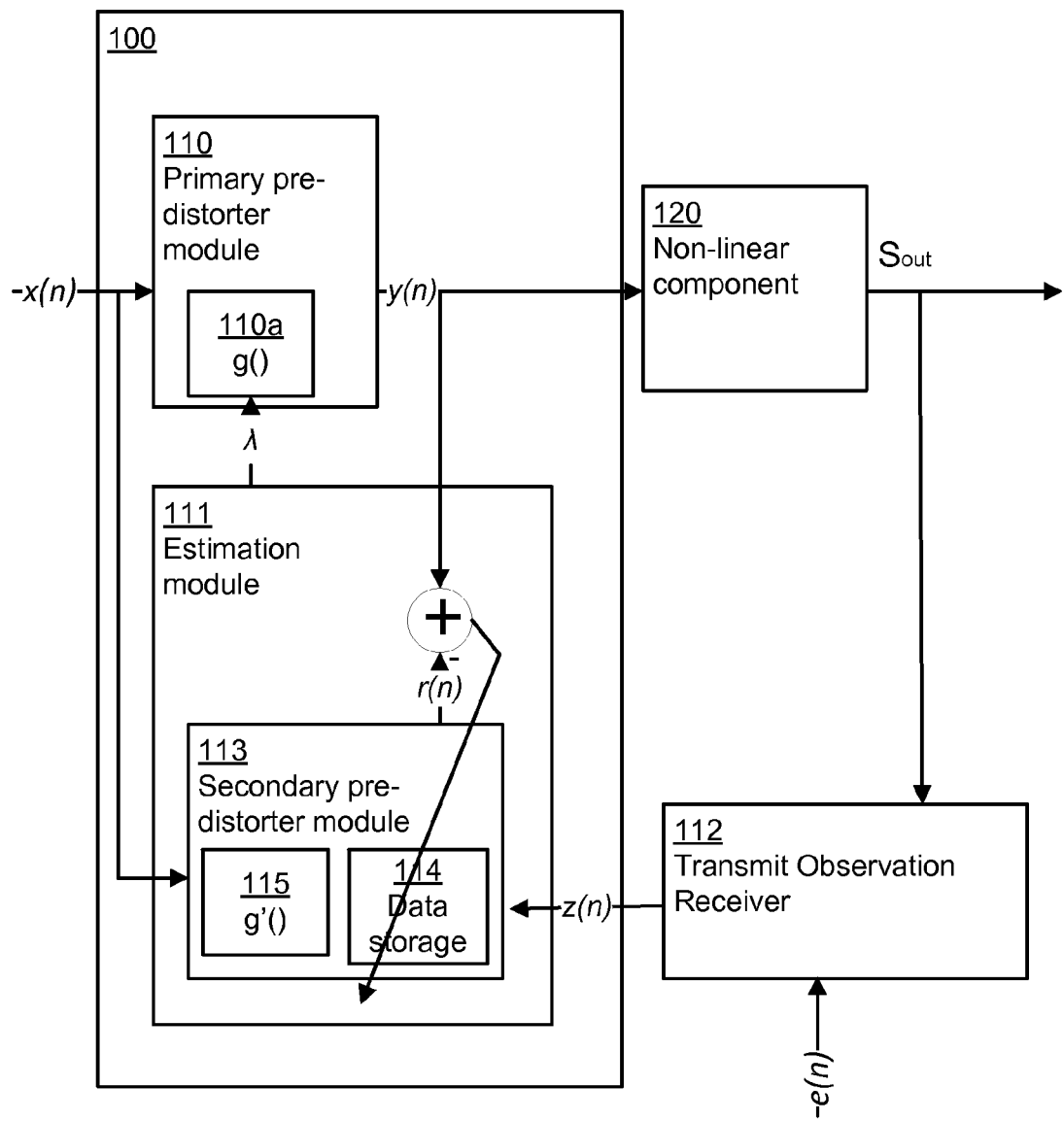
FIG. 1 is a block diagram illustrating a circuit according to some aspects of the present disclosure.

The present teaching relates to mitigating distortion affecting an output signal produced by a non-linear component. The present technique is applicable to any electronic or optical system as well as any wireless communication system where a component exhibits a non-linear behavior.

Herein, mitigating distortion is to be construed as mitigating the distortion affecting the output signal being fed to a next component in a circuit, and/or affecting the output signal to be transmitted to a receiver via a communication channel, e.g. via a wireless communication channel prone to noise.

The various circuits referred to herein are according to different aspects implemented as, e.g., application-specific integrated circuit (ASIC), field-programmable logic array (FPGA), or general purpose processor.

As mentioned in the background section, distortion is difficult to predict and compensate for in the presence of noise. State-of-the-art pre-distortion techniques tend to present convergence issues and/or be quite complex. Some pre-distortion techniques also become biased in the presence of noise.

An account of a commonly deployed DPD algorithm for linearization of non-linear component output signals will now be given, followed by an account of the proposed linearization technique.

The commonly deployed DPD algorithm often generates a pre-distorted signal y(n) expressed, in e.g. the following way:

$$y(n)=g(|x(n)|;\lambda)\cdot x(n) \quad (1)$$

where g is the primary pre-distortion function parameterized with a pre-distortion parameter vector $\lambda$, and taking the absolute value or amplitude of the input signal x(n) as an argument. The input signal x is assumed sampled in time, where n denotes a sample index.

According to one aspect, y(n) undergoes digital to analog conversion before being input to the non-linear component 120, the time index n is then replaced by a continuous time variable t.

The pre-distorter module aims at inverting a non-linear model describing the non-linearity of the non-linear component. In other words, the function g attempts to invert the non-linear model characterizing the non-linear component using optimal pre-distortion parameter vector $\lambda$. An estimation module in charge of estimating the pre-distortion parameter vector shall update the pre-distortion parameters so as to converge towards the optimal pre-distortion parameters. Estimating the pre-distortion parameters involves a secondary pre-distorter module characterized by a secondary pre-distortion function g'. The secondary pre-distorter module generates a secondary pre-distorter output signal r(n) based on samples z(n) of the output signal of the non-linear component. Thus, the samples or sampled output signal z(n) is related to the output signal Sout but generally comprises noise in addition to the signal samples.

Converging towards optimal or near-optimal pre-distortion parameter vector $\lambda$ amounts to minimizing an error signal, or a difference signal, between the pre-distorted signal y(n) and the (noisy) secondary pre-distorter output signal r(n). This can be seen as minimizing a cost function given by:

$$V(\lambda)=E(|y(n)-r(n)|^2), \quad (2)$$

where the dependence of y(n) and r(n) on $\lambda$ is explicit via the pre-distortion functions g, g'.

The above cost function can be minimized in a number of different ways, one such approach being a least-mean squares, LMS, approach.

According to the LMS approach, an estimation of the pre-distortion parameter vector $\lambda$ that minimizes the cost function involves correlating the error signal derived from the difference (y(n)−r(n)) with the sampled output signal z(n). Thus, to minimize the error signal with LMS, the estimation module should update the pre-distortion parameters by correlating the error signal with the sampled output signal z(n).

We will now give an account of the currently proposed technique for linearization. As noted above, the sampled output signal z(n) comprises noise and the error signal therefore also comprises noise. Therefore, correlating the error signal with the noisy sampled output signal z(n) would result in increasing noise in the estimation of the pre-distortion parameters, which is not desirable. Consequently, it is herein proposed to estimate the pre-distortion parameters $\lambda$ by correlating the error signal with the input signal x(n) instead of, as conventionally implemented and discussed above, correlating the error signal with the sampled output signal z(n). The proposed technique thus has the advantage of providing an increased robustness to noise of the pre-distortion parameter estimation while limiting the complexity of the pre-distortion estimation.

To further improve the convergence of the pre-distorter, it is herein disclosed that the estimation module estimating of the pre-distortion parameter vector λ uses the input signal x(n) as an argument of the secondary pre-distortion function g'. Namely, the secondary pre-distorter module is configured to generate an output signal r(n) based on a secondary pre-distortion function g' taking the input signal x(n), or a function of the input signal x(n) such as the absolute value, as an argument. This provides for a faster convergence towards optimal or near-optimal pre-distortion parameters that would permit to ideally compensate for distortion in the non-linear component.

Aspects of the present disclosure will be described more fully hereinafter with reference to the accompanying drawings. The circuit, digital signal processing device, radio-link transceiver, and method disclosed herein can, however, be realized in many different forms and should not be construed as being limited to the aspects set forth herein. Like numbers in the drawings refer to like elements throughout.

FIG. 1 shows a block diagram illustrating a circuit 100 according to some aspects of the present teaching. The circuit 100 linearizes an output signal Sout produced by a non-linear component 120 based on an input signal x(n). In other words, the circuit 100 inverts a non-linearity or a non-linear model characterizing the non-linear component 120. The circuit 100 comprises a primary pre-distorter module 110 configured to generate a pre-distorted signal y(n) based on the input signal x(n) and a primary pre-distortion function g( ) 110a parameterized by a pre-distortion parameter $\lambda_{k-1}$. The primary pre-distorter module 110 is configured to feed the pre-distorted signal y(n) to the non-linear component 120. In other words, a pre-distorter module is adapted to invert the non-linear model describing the non-linearity of a non-linear component, such as component 120. The pre-distorter module attempts to compensate for the non-linear distortion produced by the non-linear component using a pre-distortion function. The pre-distortion function g( ) is expressed as a non-linear inverse function parameterized with one or more pre-distortion parameters comprised in a vector λ. In other words, the pre-distortion parameter vector λ define the pre-distortion function, and thus also determines the quality of the pre-distortion. The pre-distortion parameter vector λ is referred to below as a pre-distortion parameter vector. A pre-distorter module is for example a digital pre-distorter, DPD.

According to some aspects, the primary pre-distorter module 110 generates a pre-distorted signal y(n) expressed, in the following way:

$$y(n)=g(|x(n)|;\lambda)\cdot x(n) \quad (3)$$

where g is the primary pre-distortion function 110a parameterized by the pre-distortion parameter vector λ, x(n) is the input signal. The primary pre-distortion function g takes the absolute value of x(n) as an argument. The input signal x(n) is e.g. a transmit signal in a wireless device, and the absolute value of x(n) is the amplitude of the transmit signal. It is noted that no memory effects are accounted for, although such an extension to account for memory effects is straight forward. The pre-distortion function of a pre-distorter module is parameterized with pre-distortion parameters to be determined by an estimation module, such as estimation module 111.

The circuit 100 further comprises an estimation module 111 configured to receive a sampled output signal z(n), i.e., samples z(n) of the output signal Sout shown in FIG. 1. The estimation module 111 comprises an interface or a port adapted to receive the samples z(n). The samples z(n) are, for example, provided by a transmit observation receiver 112, TOR, configured to sample the output signal Sout of the non-linear component 120. For example, the TOR 112 samples the output signal Sout at a sampling rate which is lower than the sampling rate of the pre-distorted signal y(n). According to some aspects, the sampling rate of the TOR signal is half the sampling rate of the pre-distorted signal y(n). The TOR 112, generates a samples z(n) based on the output signal Sout and noise e(n), herein modelled as:

$$z(n)=f(|y(n)|;\theta_0)\cdot y(n)+e(n) \quad (4)$$

where f denotes the model of the non-linear component parameterized by vector $\theta_0$, y(n) denotes the pre-distorted signal and e(n) denotes noise. The noise comprises e.g. additive white Gaussian noise (AWGN).

A very noisy TOR usually leads to problems finding an optimal parameter vector λ, since many algorithms that attempt to estimate the parameter vector λ deliver biased estimates of vector λ when the sample z(n) is noisy. The technique disclosed herein alleviates or overcomes these problems.

The estimation module 111 is configured to determine the pre-distortion parameter $\lambda_k$. Thus, the primary pre-distorter module uses a (k−1):th version of the pre-distortion parameter λ, while the secondary pre-distorter module determines a k:th version of said pre-distortion parameter λ, whereupon the pre-distortion parameter of the primary pre-distorter module may be updated by a new k:th pre-distortion parameter λ.

The estimation module 111 comprises a secondary pre-distorter module 113 configured to generate a secondary pre-distorter output signal r(n) based on a secondary pre-distortion function g'( ) 115 and the samples z(n) provided by, e.g., the TOR 112. The secondary pre-distortion function g'( ) 115 is parameterized by pre-distortion parameter vector $\lambda_k$.

According to some aspects, the secondary pre-distortion function g'( ) 115 is a look-up table, LUT. The look-up table comprises determined pre-distortion parameters indexed using an amplitude of the sampled output signal z(n), i.e. the samples z(n) of the output signal Sout. For example, a LUT function of interpolation order p is expressed in the following way as a function of z(n):

$$r(n) = \left(\sum_{l=0}^{L-1} \lambda_l P_l^p(|z(n)|)\right) z(n),$$

where the pre-distortion parameter is here represented by a vector of length L and elements $\lambda_l$, l=0, 1, . . . , L−1.

According to some aspects, the secondary pre-distortion function g'( ) 115 is a polynomial with the samples z(n) as an argument and determined pre-distortion parameters as coefficients. For example, the secondary pre-distortion function g'( ) is a polynomial expressed as:

$$r(n)=(c_0+c_1|z(n)|+ \ldots +c_L|z(n)|^{L-1})\cdot z(n) \quad (5)$$

where the pre-distortion parameter is now represented by L-length vector of coefficients $\lambda=[c_0 \ldots c_{L-1}]$.

As will be further clarified below, other aspects of the present disclosure comprises other types of pre-distortion functions g( ), g'( ) in particular such types that are indexed, or take as argument, the input signal x(n) instead of the samples z(n). It is appreciated that the parameter vector λ parameterizing the secondary pre-distortion function g'( ) 115 is the same type of parameter vector λ used to parameterize the primary pre-distortion function. However, the primary pre-distortion function is parameterized by a previous version of vector λ, while the secondary pre-distortion function g'( ) is parameterized by more recent version of vector λ. At some instants in time, the parameter vector λ is transferred from the secondary g'( ) to the primary pre-distortion function g( ), whereupon the primary pre-distortion function g( ) is updated.

The estimation module 111 is configured to determine the pre-distortion parameter $\lambda_k$ based on a previously determined pre-distortion parameter, such as $\lambda_{k-1}$ stored on a data storage 114, the secondary pre-distorter output signal r(n) and the pre-distorted signal y(n) provided by the primary pre-distorted module 110, where k denotes a version of the parameter vector. The estimation module 111 stores for example the determined pre-distortion parameter in the data storage 114 at each iteration k determining the pre-distortion parameter. This way, the pre-distortion parameter is available to the estimation module 111 for determining the next pre-distortion parameter. Determining the pre-distortion parameter λ comprises e.g. updating the pre-distortion parameter. The data storage 114 refers to any suitable type of computer readable memory, such as volatile and/or non-volatile type.

Thus, according to some aspects, the estimation module 111 is configured to iteratively determine the pre-distortion parameter λ. Determining the pre-distortion parameter involves for example training of the primary pre-distorter module. The estimation module 111 determines iteratively the pre-distortion parameter(s) at the estimation module 111. The estimation module 111 periodically provides pre-distortion parameter vector to the primary pre-distorter module 110. For example, the estimation module 111 performs the following:

1. Estimate the pre-distortion parameters using the estimation module 111.
2. At regular time intervals, provide the estimated pre-distortion parameter vector to the primary pre-distorter module 110.
3. Return to 1, and iterate.

In an illustrative example where the disclosed technique is applied, at the $k^{th}$ iteration, the estimation module 111 updates the pre-distortion parameter $\hat{\lambda}_k$ while the primary pre-distorter module 110 uses the pre-distortion parameter $\hat{\lambda}_{k-1}$ from the previous iteration. While iterating and thus replacing the previously applied pre-distortion parameter $\hat{\lambda}_{k-1}$ with the current estimated pre-distortion parameter $\hat{\lambda}_k$, the pre-distortion parameter vector $\hat{\lambda}_k$ tends towards the optimal pre-distortion parameter vector $\hat{\lambda}_{opt}$, that linearizes the non-linear model of the component 120.

According to some aspects, the estimation module 111 determines $\hat{\lambda}_k$ by correlating the input signal x(n) with an error signal between the pre-distorted signal y(n) and the secondary pre-distorter output signal r(n). The error signal is for example derived from a difference between the pre-distorted signal y(n) and the secondary pre-distorter output signal r(n). In other words, the error signal is a difference signal between the pre-distorted signal y(n) and the secondary pre-distorter output signal r(n). According to some aspects, determining the pre-distortion parameter by correlating the input signal x(n) with an error signal between the pre-distorted signal y(n) and the secondary pre-distorter output signal r(n) is performed as follows:

$$\hat{\lambda}_k(n) = \hat{\lambda}_k(n-1) + \mu \cdot (y(n) - r(n)) \cdot (x(n) \cdot \nabla_{g'}(\hat{\lambda}_k(n-1); |z(n)|))^* = \hat{\lambda}_k(n-1) + \mu \cdot (y(n) - g'(|z(n)|; \hat{\lambda}_k(n-1)) \cdot z(n)) \cdot (x(n) \cdot \nabla_{g'}(\hat{\lambda}_k(n-1); |z(n)|))^* \quad (6)$$

where g'( ) is the secondary pre-distortion function, ( )* denotes complex conjugate and μ is a step-size. Furthermore, $\nabla_g \cdot (\hat{\lambda}_k(n-1); |z(n)|)$ is the gradient of g'(.) evaluated with the previously determined pre-distortion parameter (i.e. based on the currently stored estimate of the pre-distortion parameter).

A module or unit for performing said correlation and determining of $\hat{\lambda}_k$ is not explicitly shown in FIG. 1, but is nevertheless assumed comprised in the estimation module 111.

A benefit with the proposed technique is that bias due to noise is significantly reduced in the pre-distortion parameter estimation. The estimated pre-distortion parameters are affected by noise but not biased due to noise. The impact of systematic errors due to noise is minimized.

In FIG. 1, the signals x(n), y(n), z(n) are considered time-aligned. The input signal x(n) at the secondary pre-distorter module is susceptible to experience a delay with respect to the pre-distorted signal y(n) and/or the samples z(n). In such a situation, time-alignment needs to be performed on the signals.

According to some aspects of this disclosure, the secondary pre-distortion function g'( ) 115 takes the input signal x(n) of the primary pre-distorter module 110 as an argument in order to determine the pre-distortion parameter $\lambda_k$. The secondary pre-distorter module 113 generates an output signal r(n) using the samples z(n) of the output signal Sout and the secondary pre-distortion function g'( ) that is parameterized by $\lambda_k$ and takes the input signal x(n) of the primary pre-distorter 110 as an argument. For example, the secondary pre-distorter module 113 performs the following secondary pre-distortion function g' 115 taking the absolute value of the amplitude of the input signal x(n):

$$r(n) = (g'(|x(n)|; \lambda) \cdot z(n)) \quad (7)$$

According to some aspects, the estimation module 111 determines or updates the pre-distortion parameter $\lambda_k$, as follows:

$$\hat{\lambda}_k(n) = \hat{\lambda}_k(n-1) + \mu \cdot (y(n) - g(|x(n)|; \hat{\lambda}_k(n-1)) \cdot z(n)) \cdot (x(n) \cdot \nabla_{g'}(\hat{\lambda}_k(n-1); |x(n)|))^* \quad (8)$$

It is thus provided in this disclosure an improved technique to update pre-distortion parameters, which minimizes the error between the pre-distorted signal y(n) and the secondary pre-distorter output signal r(n) (i.e. to minimize the cost function in e.g. Eq. (2)). Performing pre-distortion according to the primary pre-distortion function g( ) 110a parameterized by a pre-distortion parameter updated according to Eq. (8) provides a faster convergence towards optimal or near-optimal pre-distortion parameters. Optimal pre-distortion parameters when used in the primary pre-distorter module 110 provide a pre-distorted signal to the non-linear component 120 that result in a minimized or reduced distortion from the non-linear component. Updating the pre-distortion parameters according to Eq. (8) provides an improved adaptation technique with limited complexity.

According to some aspects, the secondary pre-distortion function g'( ) 115 comprises a look-up table, LUT. The look-up table comprises determined pre-distortion parameters indexed using an amplitude of the input signal x(n) or the absolute value of the amplitude of the input signal x(n). For example, an LUT function of interpolation order p is expressed in the following way as a function of x(n):

$$r(n) = \left(\sum_{l=0}^{L-1} \lambda_l P_l^p(|x(n)|)\right) z(n).$$

With the LUT function of interpolation order p, the gradient vector is independent of $\hat{\lambda}_{k-1}$ and the gradient vector is e.g. expressed as:

$$\nabla_g(|x(n)|) = \begin{bmatrix} P_0^p(|x(n)|) \\ P_1^p(|x(n)|) \\ \vdots \\ P_L^p(|x(n)|) \end{bmatrix} \quad (9)$$

It is thus provided in this disclosure an improved technique which proposes to perform LUT indexation using x(n) rather than using z(n). This technique provides improved convergence towards optimal pre-distortion parameters and eventually achieves an improved distortion mitigation of the output signal Sout.

According to some aspects, the secondary pre-distortion function g'( ) 115 comprises a polynomial with the input signal x(n) as an argument and determined pre-distortion parameters as coefficients. For example, the secondary pre-distortion function g'( ) taking the absolute value of the amplitude of the input signal x(n) as an argument is a polynomial function expressed as:

$$r(n) = (c_0 + c_1|x(n)| + \ldots + c_L|x(n)|^{L-1}) \cdot z(n) \quad (10)$$

Here $\lambda = [c_0 \ldots c_{L-1}]$. The polynomial function is linear in the pre-distortion parameter vector $\hat{\lambda}$, which simplifies estimation of the pre-distortion parameters.

According to some aspects, the primary pre-distorter module 110 and/or the secondary pre-distorter module 113 are/is configured to operate according to a memoryless pre-distortion function. The primary pre-distortion function g( ) 110a and/or the secondary pre-distortion function g'( ) 115 comprise a memoryless pre-distortion function. In a memoryless pre-distortion function, the current output depends only on the present input signal. The memoryless pre-distortion function depends only for example on the signal magnitude and is time-invariant. The primary/secondary pre-distortion functions g, g' described above are memoryless pre-distortion functions. The technique disclosed herein is applicable to both memoryless pre-distortion functions and pre-distortion functions including memory effects.

According to some aspects, the primary pre-distorter module 110 and/or the secondary pre-distorter module 113 are/is configured to operate according to a pre-distortion function including memory effects. Then, the primary pre-distortion function g( ) 110a and/or the secondary pre-distortion function g'( ) 115 comprises a pre-distortion function including memory effects, i.e. taking into account the memory of the non-linear component. In a pre-distortion function including memory effects, the current output depends not only on the present input signal but also on the previous input signals. A pre-distortion function including memory effects is e.g. expressed as:

$$y(n) = g(|x(n)|, x(n-\tau_1)e^{-j\psi} \ldots, x(n-\tau_M)e^{-j\psi}; \lambda) \cdot e^{j\psi} \quad (11)$$

where M>0.

According to some aspect, a pre-distortion function including memory effects comprises a Volterra function or a memory function using several LUTs.

The circuit 100 refers to any suitable type of computation unit, e.g. a microprocessor, digital signal processor (DSP), field programmable gate array (FPGA), or application specific integrated circuit (ASIC) or any other form of circuitry. It should be appreciated that the circuit need not be provided as a single unit but may be provided as any number of units or circuitry.

Figure 2:
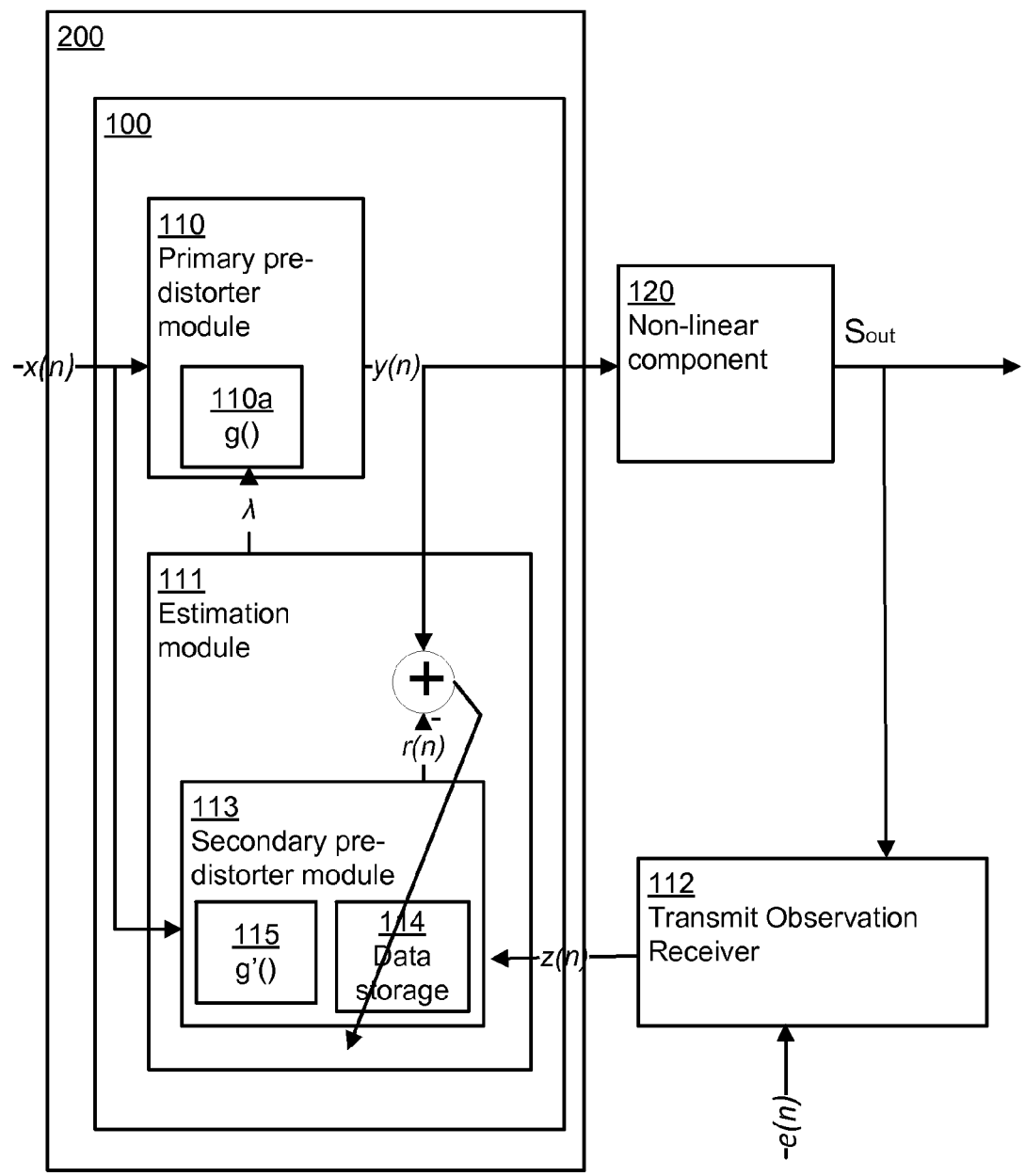
FIG. 2 is a block diagram illustrating a digital signal processing device according to some aspects of the present disclosure.

With reference to FIG. 2, one of the many applications of the present teaching is performed in a digital signal processing device 200. Thus, there is disclosed herein a digital signal processing device 200 comprising the circuit 100 according to any of the aspects discussed above.

Figure 3:
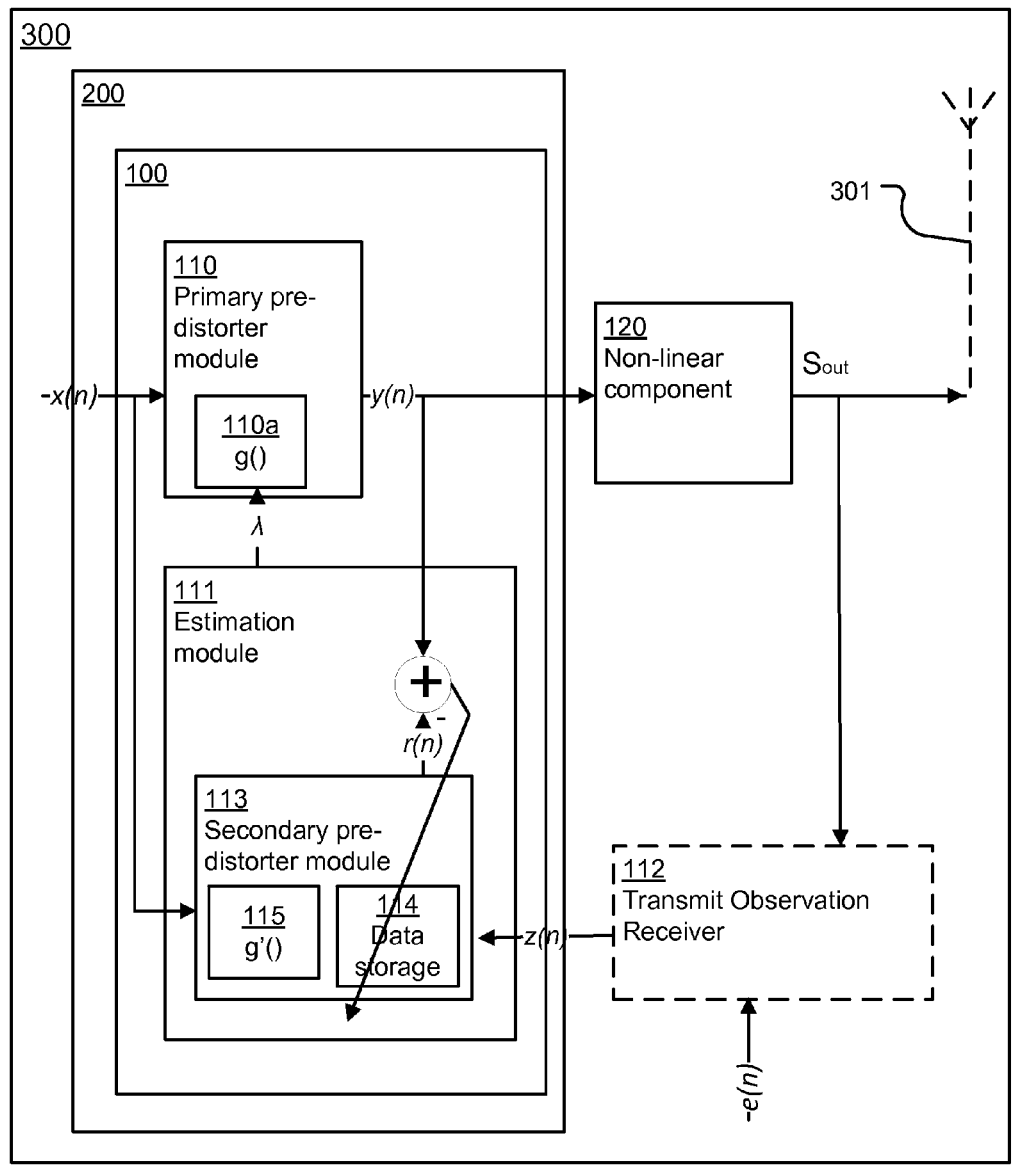
FIG. 3 is a block diagram illustrating a radio-link transceiver according to some aspects of the present disclosure.

With reference to FIG. 3, one of the many applications of the present teaching is performed in a radio-link transceiver 300. Thus, there is disclosed herein a radio-link transceiver 300 comprising the digital signal processing device 200. The radio-link transceiver 300 comprises a non-linear component 120 configured to obtain the pre-distorted signal and to transform the pre-distorted signal into an output signal to be transmitted. The digital signal processing device 200 comprises the circuit 100 according to any of the aspects discussed above and is configured to provide a pre-distorted signal to the non-linear component 120.

According to some aspects, the non-linear component 120 comprises an essentially memoryless non-linear component, or a non-linear component with memory.

According to some aspects, the non-linear component 120 comprises a power amplifier, and/or a mixer. The radio-link transceiver 300 comprises e.g. a wireless communication interface and/or an antenna 301.

Figure 4:
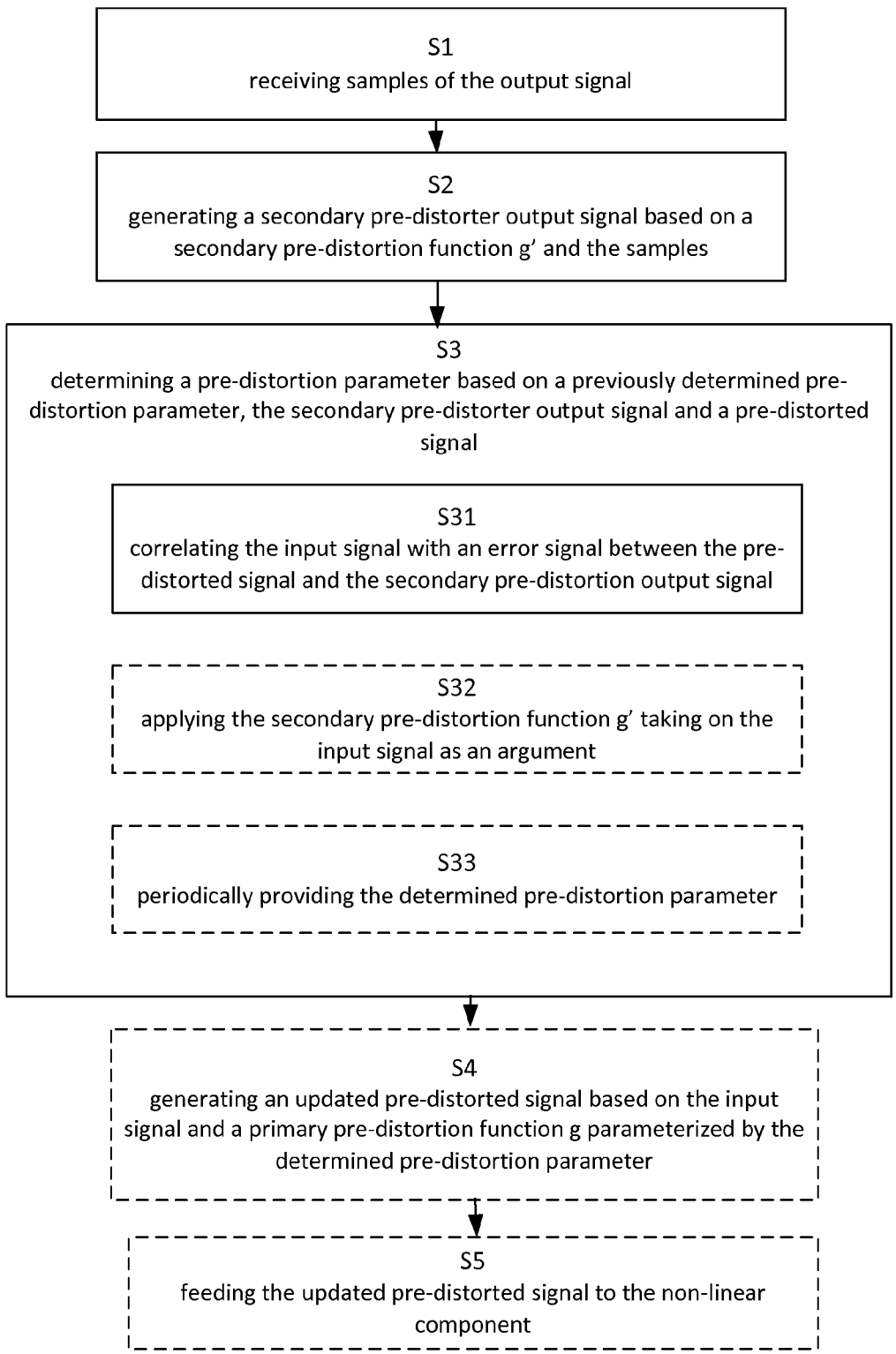
FIG. 4 is a flowchart illustrating methods according to some aspects of this disclosure.

FIG. 4 shows a flowchart illustrating methods according to some aspects of this disclosure. There is illustrated a method for linearizing an output signal Sout produced by a non-linear component 120 based on an input signal x(n). The method may be performed in a circuit, a device such as a digital signal processing device and/or a radio-link transceiver. The method comprises receiving S1 samples z(n) of the output signal Sout. The step of receiving S1 samples z(n) of the output signal Sout is performed e.g. at an estimation module 111.

According to some aspects, receiving S1 samples z(n) of the output signal Sout comprises receiving samples z(n) from a transmit observation receiver, TOR 112, that generates the samples z(n) based on the output signal Sout and noise e(n). The noise comprises e.g. additive white Gaussian noise.

The method comprises generating S2 a secondary pre-distorter output signal r(n) based on a secondary pre-distortion function g'( ) 115 and the samples z(n). The secondary pre-distortion function g'( ) 115 is parameterized by pre-distortion parameter vector $\lambda_k$. The step of generating S2 a secondary pre-distorter output signal r(n) is performed e.g. using a secondary pre-distorter module 113 or using the estimation module 111 comprising the secondary pre-distorter module 113.

According to some aspects, the secondary pre-distorter 113 generates the output signal r(n) using a look-up table indexed by the amplitude of the samples z(n) or a polynomial as given e.g. in Eq. (5).

The method comprises determining S3 a pre-distortion parameter $\lambda_k$ based on a previously determined pre-distortion parameter, e.g. $\lambda_{k-1}$, the secondary pre-distorter output signal r(n) and a pre-distorted signal y(n), where k denotes a version of the parameter vector. In other words, determining S3 the pre-distortion parameter $\lambda_k$ comprises e.g. updating the pre-distortion parameter $\lambda_k$. Determining S3 a pre-distortion parameter $\lambda_k$ is for example performed using an estimation module 111 comprising the secondary pre-distorter module 113.

According to some aspects, the step of determining S3 is iterative. Determining S3 the pre-distortion parameter $\lambda_k$ involves for example training of a primary pre-distorter module 110, i.e. iteratively estimating the pre-distortion parameters to be used in the primary pre-distorter module 110. According to some aspects, determining S3 a pre-distortion parameter comprises periodically providing S33 the determined pre-distortion parameter $\lambda$ to e.g. the primary pre-distorter module 110. For example, the step of determining S3 comprises performing the following:
1. Determining the pre-distortion parameter vector.
2. At regular time intervals, providing the estimated pre-distortion parameter vector to e.g. the primary pre-distorter module 110.
3. Returning to 1, and iterating.

Iterating and thus providing the previously applied pre-distortion parameter $\hat{\lambda}_{k-1}$ with the current estimated pre-distortion parameter $\hat{\lambda}_k$ allows the pre-distortion parameter vector $\hat{\lambda}_k$ to converge towards the optimal pre-distortion parameter vector.

Determining S3 comprises correlating S31 the input signal x(n) with an error signal between the pre-distorted signal y(n) and the secondary pre-distorter output signal r(n). According to some aspects, determining S3 a pre-distortion parameter $\lambda$ by correlating the input signal x(n) with an error signal between the pre-distorted signal y(n) and the secondary pre-distorter output signal r(n) comprises computing the pre-distortion parameter $\lambda$ according to Eq. (6).

A benefit with the proposed technique is that the process of determining the pre-distortion parameter is robust to noise.

According to some aspects, determining S3 a pre-distortion parameter comprises applying S32 the secondary pre-distortion function g'( ) 115 that takes the input signal x(n) as an argument. Applying S32 the secondary pre-distortion function 115 g'( ) with the input signal x(n) as an argument comprises e.g. performing (at the secondary pre-distorter module 113) pre-distortion or compensation based on the samples z(n) and the secondary pre-distortion function g'( ) 115 taking the input signal x(n) as an argument. For example, the secondary pre-distortion function g'( ) 115 that takes an absolute value of an amplitude of the input signal x(n) as an argument, as provided in Eq. (7).

According to some aspects, determining S3 a pre-distortion parameter comprises determining or updating the pre-distortion parameter $\lambda_k$ according to e.g. Eq. (8).

Further beneficial effects are hereby obtained: increased robustness of the estimated pre-distortion parameters to noise, and a faster convergence towards optimal or near-optimal pre-distortion parameters. Optimal or near-optimal pre-distortion parameters when used in the primary pre-distorter module 110 allow a pre-distorted signal to experience a reduced or minimized distortion from the non-linear component.

According to some aspects, the secondary pre-distortion function g'( ) 115 comprises a look-up table, the look-up table comprising the pre-distortion parameters indexed using an amplitude of the input signal x(n). For example, the secondary pre-distortion function g'( ) 115 comprises a look-up table using the absolute value of the amplitude of the input signal x(n) as:

$$r(n) = \left(\sum_{l=0}^{L-1} \lambda_l P_l^p(|x(n)|)\right) z(n).$$

According to some aspects, the secondary pre-distortion function g'( ) 115 comprises a polynomial with the input signal x(n) as an argument and the pre-distortion parameters as coefficients. For example, the secondary pre-distortion function g'( ) 115 comprises a polynomial taking the absolute value of the amplitude of the input signal x(n) as an argument as given in Eq. (10).

According to some aspects, the primary pre-distortion function g( ) 110a and/or the secondary pre-distortion function g'( ) 115 comprise a memoryless pre-distortion function. For example, the primary pre-distortion function g( ) 110a and/or the secondary pre-distortion function g'( ) 115 comprise a pre-distortion function where delay is not accounted for.

According to some aspects, the primary pre-distortion function g( ) 110a and/or the secondary pre-distortion function g'( ) 115 comprise a pre-distortion function including memory effects. For example, the primary pre-distortion function g( ) 110a and/or the secondary pre-distortion function g'( ) 115 comprise a pre-distortion function expressed as in Eq. (11).

The advantages of the proposed technique are at least two-fold. First, the robustness to noise in determining the pre-distortion parameter is obtained. Second, the pre-distortion parameter vector determined according to this disclosure converges faster towards the optimal pre-distortion parameter that allows the primary pre-distorter module 110 to invert the non-linearity of the non-linear component 120.

According to some aspects, the method comprises generating S4 an updated pre-distorted signal based on the input signal x(n) and a primary pre-distortion function g( ) 110a parameterized by the determined pre-distortion parameter $\lambda$ and feeding S5 the updated pre-distorted signal to the non-linear component 120. For example, the primary pre-distorter module 110 provided with updated pre-distortion parameter $\lambda$ generates an updated pre-distorted signal based on the input signal x(n) and the primary pre-distortion function g( ) 110a (as shown in Eq. (1)) so as to compensate for the distortion affecting the signal when traversing the non-linear component 120. The disclosed methods provide an improved pre-distortion adaption with limited complexity.

It should be appreciated that FIG. 1-4 comprises some operations which are illustrated with a darker border and some operations which are illustrated with a dashed border. The operations which are comprised in a darker border are operations which are comprised in the broadest example embodiment. The operations which are comprised in a dashed border are example embodiments which may be comprised in, or a part of, or are further operations which may be taken in addition to the operations of the darker border example embodiments. It should be appreciated that these operations need not be performed in order. Furthermore, it should be appreciated that not all of the operations need to be performed. The example operations may be performed in any order and in any combination.

It should be appreciated that the example operations of FIG. 4 may be performed simultaneously for any number of device or circuit.

Figure 5:
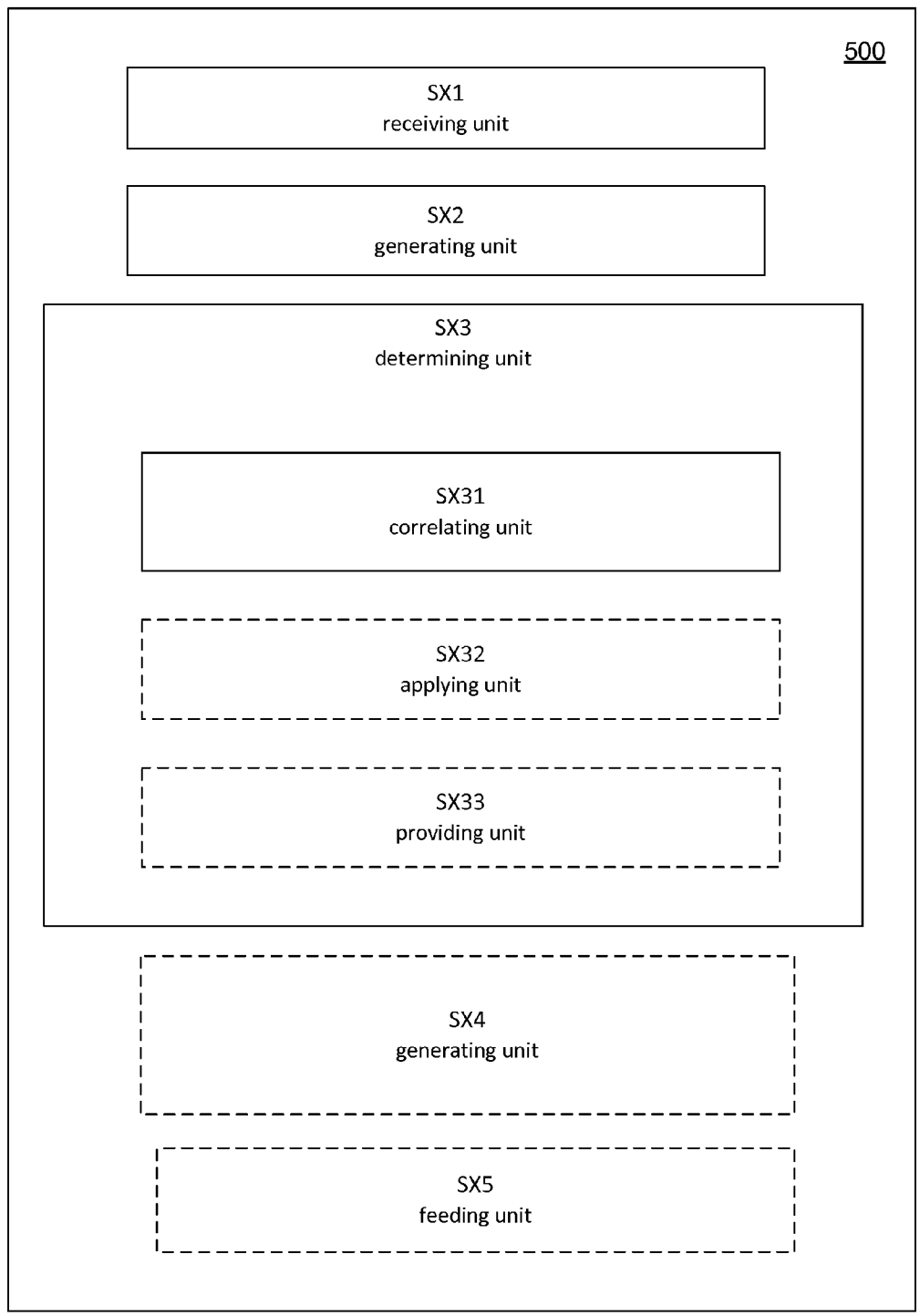
FIG. 5 is a block diagram schematically illustrating aspects of a circuit according to some aspects of the present disclosure.

FIG. 5 is a block diagram schematically illustrating aspects of a circuit configured to implement or realize at least some of the methods discussed herein. In particular, there is illustrated a circuit 500 configured to linearize an output signal Sout produced by a non-linear component 120 based on an input signal x(n). The circuit 500 comprises:

a receiving unit SX1 configured to receive samples z(n) of the output signal Sout;

a generating unit SX2 configured to generate a secondary pre-distorter output signal r(n) based on a secondary pre-distortion function g'( ) 115 and the samples z(n) of the output signal Sout; and a determining unit SX3 configured to determine a pre-distortion parameter $\lambda k$ based on a previously determined pre-distortion parameter, the secondary pre-distorter output signal r(n) and a pre-distorted signal y(n), wherein the determining comprises correlating, by a correlating unit SX31, the input signal x(n) with an error signal between the pre-distorted signal y(n) and the secondary pre-distorter output signal r(n). Hence, the determining unit SX3 comprises a correlating unit SX31.

Additionally, according to some aspects, the circuit 500 comprises an applying unit SX32 configured to apply the secondary pre-distortion function g'( ) 115 that is configured to take the input signal x(n) as an argument.

According to some further aspects, the circuit 500 comprises a providing unit SX33 configured to periodically provide the determined pre-distortion parameter.

According to some further aspects, the circuit also comprises a generating unit SX4 configured to generate an updated pre-distorted signal based on the input signal x(n) and a primary pre-distortion function g( ) 110a parameterized by the determined pre-distortion parameter $\lambda$ and a feeding unit SX5 configured to—feed S5 the updated pre-distorted signal to the non-linear component 120.

Aspects of the disclosure are described with reference to the drawings, e.g., block diagrams and/or flowcharts. It is understood that several entities in the drawings, e.g., blocks of the block diagrams, and also combinations of entities in the drawings, can be implemented by computer program instructions, which instructions can be stored in a computer-readable memory, and also loaded onto a computer or other programmable data processing apparatus. Such computer program instructions can be provided to a processor of a general purpose computer, a special purpose computer and/or other programmable data processing apparatus to produce a machine, such that the instructions, which execute via the processor of the computer and/or other programmable data processing apparatus, create means for implementing the functions/acts specified in the block diagrams and/or flowchart block or blocks.

In some implementations and according to some aspects of the disclosure, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved. Also, the functions or steps noted in the blocks can according to some aspects of the disclosure be executed continuously in a loop.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The various example embodiments described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A circuit for linearizing an output signal Sout produced by a non-linear component based on an input signal (x(n)), the circuit comprising:

a primary pre-distorter module configured to generate a pre-distorted signal (y(n)) based on the input signal (x(n)) and a primary pre-distortion function g( ) parameterized by a pre-distortion parameter ($\lambda_{K-1}$) and to feed the pre-distorted signal (y(n)) to the non-linear component; and an estimation module configured to receive samples (z(n)) of the output signal Sout, and to determine the pre-distortion parameter ($\lambda_k$);

wherein the estimation module comprises a secondary pre-distorter module configured to:

generate a secondary pre-distorter output signal (r(n)) based on a secondary pre-distortion function g'( )and the samples (z(n)) of the output signal Sout, and determine the pre-distortion parameter (Ak) based on a previously determined pre-distortion parameter stored on a data storage, the secondary pre-distorter output signal (r(n)) and the pre-distorted signal (y(n)) provided by the primary pre-distorted module, wherein the determining comprises correlating the input signal (x(n)) with an error signal between the pre-distorted signal (y(n)) and the secondary pre-distorter output signal (r(n)).

2. The circuit according to claim 1, wherein the secondary pre-distortion function g'( )is configured to take the input signal (x(n)) as an argument in order to determine the pre-distortion parameter ($\lambda_k$).

3. The circuit according to claim 2, wherein the secondary pre-distortion function g'( )comprises a look-up table, the look-up table comprising determined pre-distortion parameters indexed using an amplitude of the input signal (x(n)).

4. The circuit according to claim 2, wherein the secondary pre-distortion function g'( )comprises a polynomial with the input signal (x(n)) as an argument and determined pre-distortion parameters as coefficients.

5. The circuit according to claim 1, wherein the primary pre-distorter module and/or the secondary pre-distorter module are/is configured to operate according to a memoryless pre-distortion function.

6. The circuit according to claim 1, wherein the primary pre-distorter module and/or the secondary pre-distorter module are/is configured to operate according to a pre-distortion function including memory effects.

7. The circuit (100) according to claim 1, wherein the estimation module is configured to iteratively determine the pre-distortion parameter ($\lambda_k$).

8. The circuit according to claim 1, wherein the estimation module is configured to periodically provide the determined pre-distortion parameter ($\lambda$) to the primary pre-distorter module.

9. A digital signal processing device for linearizing a non-linear component, the digital signal processing device comprising the circuit according to claim 1.

10. A radio-link transceiver comprising:
the non-linear component configured to obtain the pre-distorted signal and to transform the pre-distorted signal into an output signal to be transmitted;
the digital signal processing device according to claim 9, configured to provide a pre-distorted signal to the non-linear component.

11. The radio-link transceiver according to claim 10, wherein the non-linear component comprises a memoryless non-linear component, or a non-linear component with memory.

12. The radio-link transceiver according to claim 10, wherein the non-linear component comprises a power amplifier, and/or a mixer.

13. A method, performed in a circuit, for linearizing an output signal Sout produced by a non-linear component based on an input signal (x(n)), the method comprising:
receiving samples (z(n)) of the output signal Sout;
generating a secondary pre-distorter output signal (r(n)) based on a secondary pre-distortion function g'( )and the samples (z(n)) of the output signal Sout; and
determining a pre-distortion parameter ($\lambda_K$) based on a previously determined pre-distortion parameter, the secondary pre-distorter output signal (r(n)) and a pre-distorted signal (y(n)), wherein determining comprises correlating the input signal (x(n)) with an error signal between the pre-distorted signal (y(n)) and the secondary pre-distorter output signal (r(n)).

14. The method according to claim 13, wherein determining the pre-distortion parameter comprises applying the secondary pre-distortion function g'( ) that is configured to take the input signal (x(n)) as an argument.

15. The method according to claim 13, wherein the secondary pre-distortion function g'( ) comprises a look-up table, the look-up table comprising the pre-distortion parameters indexed using an amplitude of the input signal (x(n)).

16. The method according to claim 13, wherein the secondary pre-distortion function g'( ) comprises a polynomial with the input signal (x(n)) as an argument and the pre-distortion parameters as coefficients.

17. The method according to claim 13, wherein a primary pre-distortion function g( ) and/or the secondary pre-distortion function g'( )comprise a memoryless pre-distortion function.

18. The method according to claim 13, wherein a primary pre-distortion function go and/or the secondary pre-distortion function g'( )comprise a pre-distortion function including memory effects.

19. The method according to claim 13, the method comprising:
generating an updated pre-distorted signal based on the input signal (x(n)) and a primary pre-distortion function go parameterized by the determined pre-distortion parameter ($\lambda$); and
feeding the updated pre-distorted signal to the non-linear component.

20. The method according to claim 13, wherein the step of determining is iterative.

21. The method according to claim 13, wherein determining the pre-distortion parameter comprises periodically providing the determined pre-distortion parameter ($\lambda$).

22. A non-transitory computer-readable storage medium comprising a computer program comprising computer program code which, when executed in a device causes the device to execute a method performed in a circuit of the device, for linearizing an output signal Sout produced by a non-linear component based on an input signal (x(n)), the method comprising:
receiving samples (z(n)) of the output signal Sout;
generating a secondary pre-distorter output signal (r(n)) based on a secondary pre-distortion function g'( )nd the samples (z(n)) of the output signal Sout; and
determining a pre-distortion parameter ($\lambda_K$) based on a previously determined pre-distortion parameter, the secondary pre-distorter output signal (r(n)) and a pre-distorted signal (y(n)), wherein determining comprises correlating the input signal (x(n)) with an error signal between the pre-distorted signal (y(n)) and the secondary pre-distorter output signal (r(n)).

* * * * *